US011489445B2

(12) United States Patent
Yan

(10) Patent No.: US 11,489,445 B2
(45) Date of Patent: Nov. 1, 2022

(54) DYNAMIC BIAS TECHNIQUE FOR ENHANCED MOSFET ON-RESISTANCE BASED CURRENT SENSING

(71) Applicant: Analog Devices, Inc., Norwood, MA (US)

(72) Inventor: Yingyi Yan, Fremont, CA (US)

(73) Assignee: Analog Devices, Inc., Norwood, MA (US)

( * ) Notice: Subject to any disclaimer, the term of this patent is extended or adjusted under 35 U.S.C. 154(b) by 127 days.

(21) Appl. No.: 17/066,128

(22) Filed: Oct. 8, 2020

(65) Prior Publication Data

US 2022/0115955 A1 Apr. 14, 2022

(51) Int. Cl.
*H02M 3/158* (2006.01)
*G01R 19/00* (2006.01)
*G01R 31/40* (2020.01)
*H02M 1/32* (2007.01)
*H02M 1/00* (2006.01)

(52) U.S. Cl.
CPC ...... *H02M 3/1588* (2013.01); *G01R 19/0092* (2013.01); *G01R 31/40* (2013.01); *H02M 1/32* (2013.01); *H02M 1/0009* (2021.05)

(58) Field of Classification Search
None
See application file for complete search history.

(56) References Cited

U.S. PATENT DOCUMENTS

| 8,129,953 | B2* | 3/2012 | Pagano | H02M 3/156 320/141 |
| 8,823,352 | B2* | 9/2014 | Zhang | H02M 3/1588 323/286 |
| 9,525,351 | B2* | 12/2016 | Li | G01R 19/0092 |
| 10,090,813 | B2* | 10/2018 | Boström | H03F 3/187 |
| 2013/0241516 | A1* | 9/2013 | Ueno | G05F 1/618 323/285 |
| 2016/0141956 | A1 | 5/2016 | Dong | |
| 2016/0164412 | A1 | 6/2016 | Li et al. | |
| 2020/0067409 | A1 | 2/2020 | Li et al. | |

FOREIGN PATENT DOCUMENTS

| CN | 114301268 A | 4/2022 |
| JP | 2019149860 A | 9/2019 |
| WO | WO-2017014931 A1 | 1/2017 |

OTHER PUBLICATIONS

"European Application Serial No. 21201276.9, Extended European Search Report dated Feb. 18, 2022", 9 pgs.

* cited by examiner

*Primary Examiner* — Jeffrey A Gblende
(74) *Attorney, Agent, or Firm* — Schwegman Lundberg & Woessner, P.A.

(57) ABSTRACT

A switching converter circuit comprises an inductive circuit element; a driver switching circuit configured to provide energy to the inductive circuit element to generate an output voltage of the switching converter circuit, the output voltage having an alternating current (AC) signal component and a direct current (DC) signal component; a current sensing circuit configured to generate a current sense signal representative of inductor current of the inductive circuit element, wherein an output of the current sensing circuit is coupled to a bias circuit node; and a dynamic bias circuit configured to apply a dynamic bias voltage to the bias circuit node, wherein the dynamic bias voltage includes an AC component that tracks the AC signal component of the output voltage.

16 Claims, 15 Drawing Sheets

DYNAMIC BIAS TECHNIQUE FOR ENHANCED MOSFET ON-RESISTANCE BASED CURRENT SENSING

BACKGROUND

Electronic systems can include devices that require a regulated power source. Power circuits can be used to provide a circuit supply rail having a regulated voltage. Some power circuits are switching converter circuits. It is desirable to monitor the current of the power circuit. This can provide detection of overcurrent conditions or can be used to regulate the output of the power circuit. The current monitoring should provide proper operation over a range of switching frequencies.

SUMMARY OF THE DISCLOSURE

This document relates generally to switching power converters and methods of their operation. An example of a switching converter circuit includes an inductive circuit element, a driver switching circuit configured to provide energy to the inductive circuit element to generate an output voltage that has an alternating current (AC) signal component and a direct current (DC) signal component, a current sensing circuit coupled to a bias circuit node and configured to generate a current sense signal representative of inductor current of the inductive circuit element, and a dynamic bias circuit configured to apply a dynamic bias voltage to the bias circuit node, and the dynamic bias voltage includes an AC component that tracks the AC signal component of the output voltage.

An example of a method of operating a switching converter circuit includes charging and discharging an inductive circuit element using a driver and MOSFET (DrMOS) switching circuit to generate an output voltage of the switching converter circuit, monitoring inductor current of the inductive circuit element using a current sensing circuit, and applying a dynamic bias voltage to a bias circuit node of the current sensing circuit, wherein the dynamic bias voltage includes an AC component that tracks an AC signal component of the output voltage.

An example of voltage converter circuit includes a charge pump circuit including multiple switching transistors connected in series; an inductive circuit element coupled to a first switching circuit node between a first low side switching transistor and a second high side switching transistor of the multiple switching transistors; a driver circuit configured to control activation of the multiple switching transistors to generate an output voltage at an output terminal of the voltage converter circuit, the output voltage having an alternating current (AC) signal component and a direct current (DC) signal component; a current sensing circuit to generate a current sense signal representative of inductor current of the inductive circuit element, wherein the current sensing circuit is coupled to a bias circuit node; and a dynamic bias circuit configured to apply a dynamic bias voltage to the bias circuit node, wherein the dynamic bias voltage includes an AC component that tracks the AC signal component of the output voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
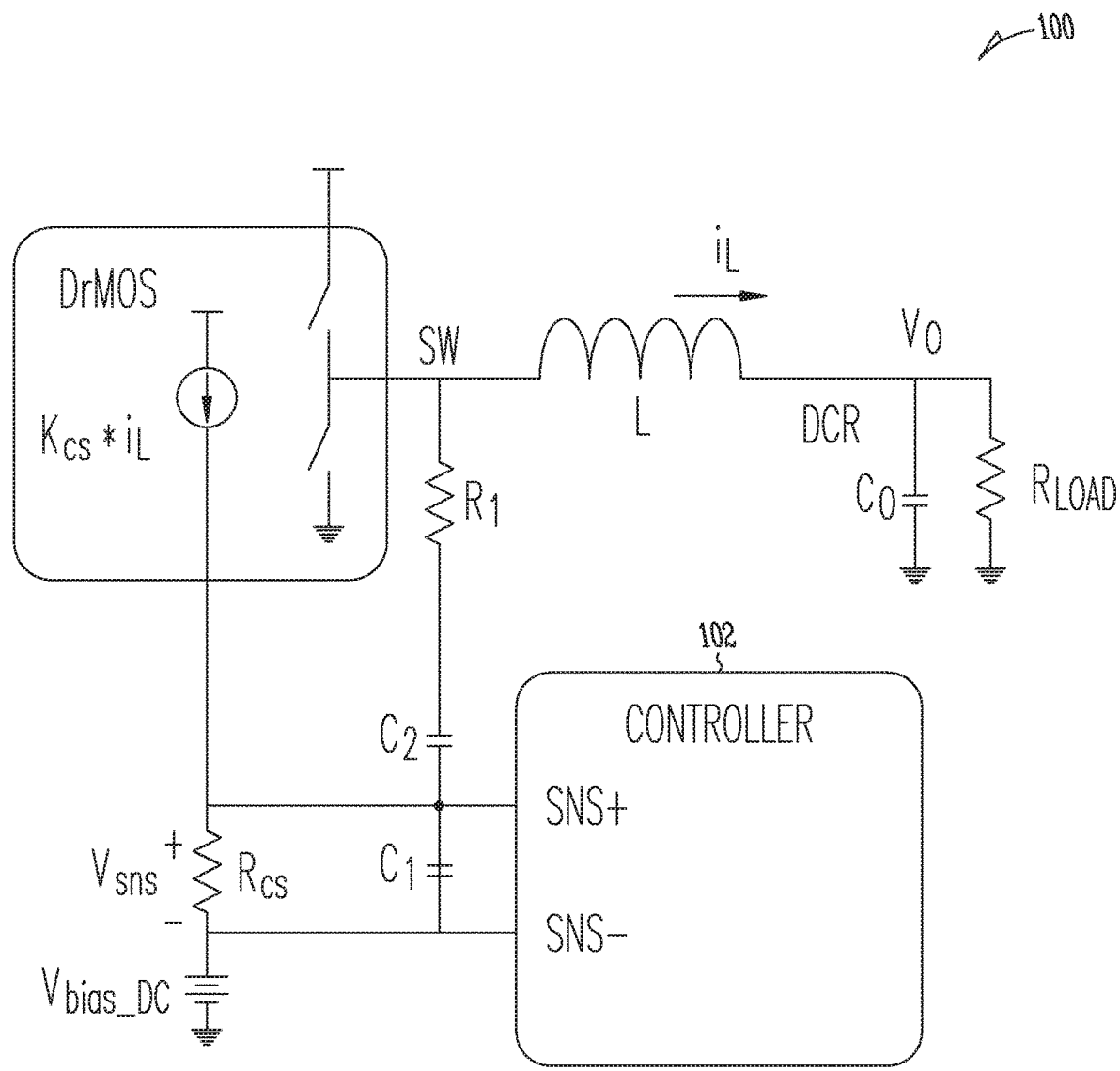
FIG. 1 is a circuit diagram of an example of a switching converter circuit.

Power circuits may need to provide a fixed or stable output voltage as an electrical circuit supply for an electronic system. Some power circuits are switching converter circuits that convert the input voltage to a regulated output voltage. The regulated voltage conversion can provide a regulated output voltage that is higher than the input voltage of the regulator, lower than the input voltage, or inverted from the input voltage. The regulation is typically achieved by recurrently charging an inductor from an energy source and then discharging the energy of the inductor to drive a load. The charging and discharging can be accomplished using electronic switches that include transistors.

It can be useful to monitor the inductor current. This monitoring can be used for closed loop control such as current mode control of pulse width modulation (PWM), and for fault protection such as overcurrent protection, and load current limiting. If the switching converter circuit operates over a range of switching frequencies, the current monitoring should be effective over the frequency range.

Inductor current signal sensing should be accurate, fast, and clean. Accurate current sensing not only means that the sensing should precisely reflect the direct current or DC current value, but also means that the sensed current value should not be exaggerated or minimized as the frequency range changes. In a frequency domain Bode plot, the current sensing gain should be a flat straight line, from zero frequency to the switching frequency, with zero phase lead and lag. From the point of view of closed loop control, distortion-free proportional gain does not create undesired pole and zero which can complicate the feedback loop design. From the point of view of fault protection, distortion free proportional current sensing also provides a consistent DC current limit and a consistent dynamic current limit.

Fast current sensing means that sensed current signal tracks the current instantaneous waveform in real time. For example, in peak current mode control, the control field effect transistor (FET) is turned on by the system clock and the inductor current linearly ramps up when the control FET is turned on. When the current sensing signal ramps up to the specified peak current threshold, the control FET is turned off and stays turned off until the next turn on time. If the sensed current signal does not immediately track the real time current waveform, the PWM control will be delayed and may run into instability.

Clean current sensing means that the sensed current signal is free of signal noise. Sensing a clean current waveform is critical for stable PWM control, especially for current mode PWM control. For current mode PWM, the control mechanism is sensitive to signal noise like spikes or ringing. In peak current mode control, a spike during the control FET on-time can falsely trip the current comparator used in the control and terminate the on-time prematurely.

Compared to other forms of switching control, a sensed inductor current waveform provides more complete information to the control system of a switched mode power converter, although current mode PWM control usually only uses the sensed current waveform of one time interval of a complete switching cycle. For example, for a peak-current mode controlled converter, only the waveform during the control FET on-time is needed for pulse width modulation. However, the current waveform sensed during the on time of the synchronize FET is also important for the control system. If the current sensed signal in this period is above the threshold due to a load dynamic or a fault event, the controller will not turn on the control FET of the following switching cycle. For an average-current mode converter, the full on-time and off-time of the inductor current sensing signal is used for the closed loop regulation. Moreover, for discontinuous conduction mode operation in any control architecture, real time inductor current sensing is needed for detection of zero crossings of the current.

One approach to inductor current sensing is to place a sensing resistor in series with the inductor and determine the inductor current by monitoring the voltage across the resistor. This method of using a current sensing resistor in series with the inductor is precise, but it induces undesired power loss.

Another approach is DC resistance (DCR) current sensing which uses the inductor equivalent winding resistance to deduce the inductor current. This approach does not add power loss into the system to sense the current. The drawback of DCR current sensing is there is a wide gain variation range due to the variation in the manufacturer's value of DCR, and also because the DCR value varies over temperature.

Still another current sensing method uses on-resistance of a power FET as an active sensing circuit element. This approach also does not add power loss to the system. The active sensing circuitry measures the voltage drop on the on-resistance and divides it by a resistance to generate a current proportional to the current at the power device. In the integrated circuit process, this resistance can be made to closely track the process variation and temperature coefficient of the power FET device, so that the current sensing gain is consistent. However, due to the switching nature of the power FET device in switched mode power converters, the sensing signal has inevitable spikes or dips around the switching edges, which adds noise to the system control. Moreover, the current at the power FET device exhibits a step change nature during the off-to-on transition of the device. Because the current sense amplifier's bandwidth is finite, it is difficult to overcome the sensing delay. For a high frequency small duty cycle switching converter, the on-time can be as short as tens of nano seconds. The noise and delay of the FET on-resistance based current sensing limits its application in inductor current sensing for a switching converter circuit.

FIG. 1 is a circuit diagram of an example of a switching converter circuit 100. The circuit has a buck converter topology and uses driver and metal oxide semiconductor field effect transistor (DRMOS) control. The DrMOS integrates power devices (e.g., power FETs) and power device drivers. Controller 102 controls the switching of the FETs to generate a regulated output voltage $V_O$ at the circuit load $R_{LOAD}$. Current sensors in the DrMOS sense the current through the power devices when the power devices are on, and source and sink a current signal proportional to the power device current. Because the sum of the currents of the power devices is equal to the inductor current, the output current of the current sensors is a current proportional to the inductor current ($Kcs \cdot i_L$). This current is converted to a voltage signal Vsns using current sensing circuit element Rcs. The current sensor is biased using an intermediate DC voltage ($V_{bias\_DC}$) in order to provide headroom to circuitry of the current sensor. The voltage signal Vsns is representative of the sensed current and the controller 102 may use Vsns for current mode PWM control, overcurrent protection, or load limiting.

A low pass filter formed by capacitance $C_1$ and the resistance Rcs attenuates the high frequency noise from the current sensor circuitry. A high pass filter formed by resistance $R_1$ and capacitance $C_2$ injects a high frequency signal from switching node SW into the sensed current signal. It is desired for the gain of the current sensing circuit to have a flat frequency response to provide accurate current sensing, and ideally remain constant from DC to infinite frequency.

Figure 2:
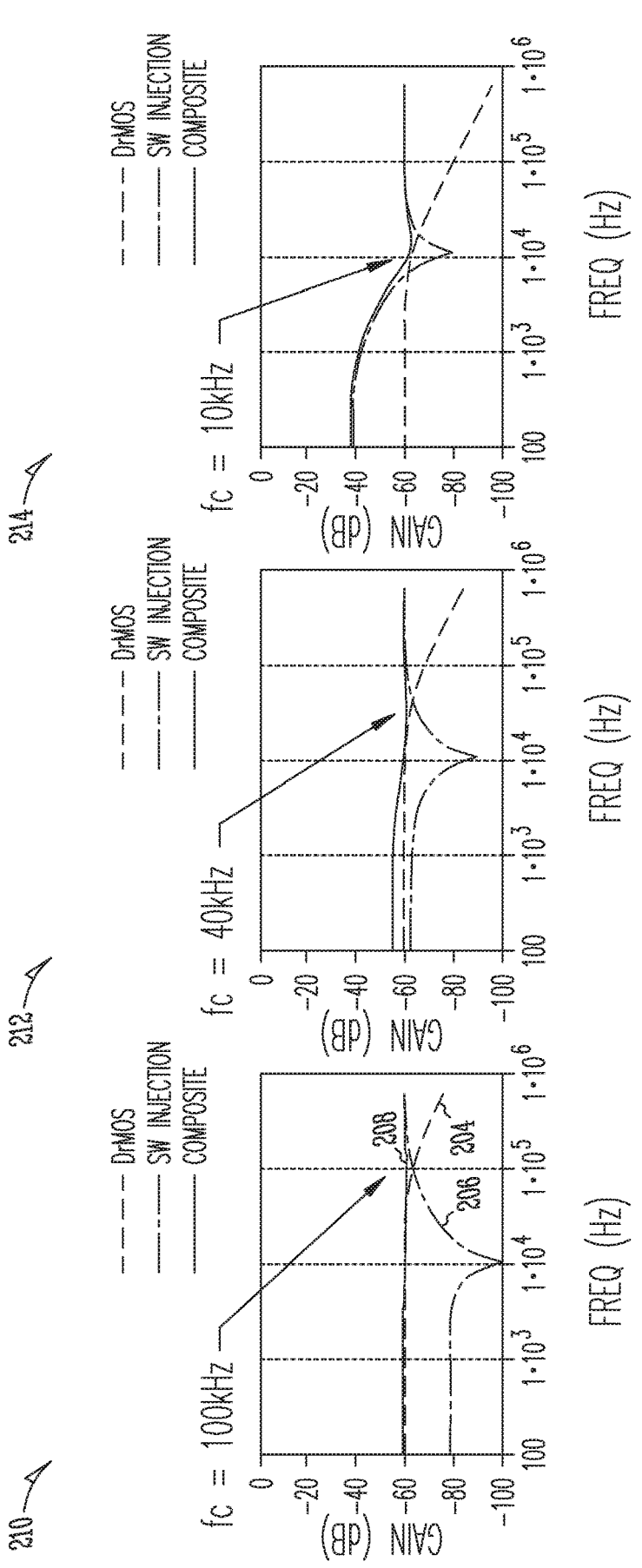
FIG. 2 shows graphs of Bode plots of the gain of current sensing of the circuit of FIG. 1.

FIG. 2 shows graphs of Bode plots of the gain of the current sensing (Vsns(s)/$i_L$(s)) of the circuit of FIG. 1. The Bode plots show the frequency response of the low pass filtered current signal 204 sourced from the DrMOS, the frequency response of the high pass filtered SW injection signal 206, and a composite frequency response 208 of the high pass and low pass filtering. The frequency response of the SW injection signal 206 shows a notch at the resonant frequency ($\omega o = 1/(L \cdot Cout)^{1/2}$) of the power stage. The Bode plots show that only if the selected corner frequency fc of the low pass filter is well above the power stage resonant frequency is the composite frequency response of the gain flat. The graphs show a flat composite frequency response when the corner frequency is an order of magnitude higher than the power stage resonant frequency (as shown in graph 210) and the response is not flat as the corner frequency gets closer to the resonant frequency (as shown in graphs 212 and 214).

Figure 3:
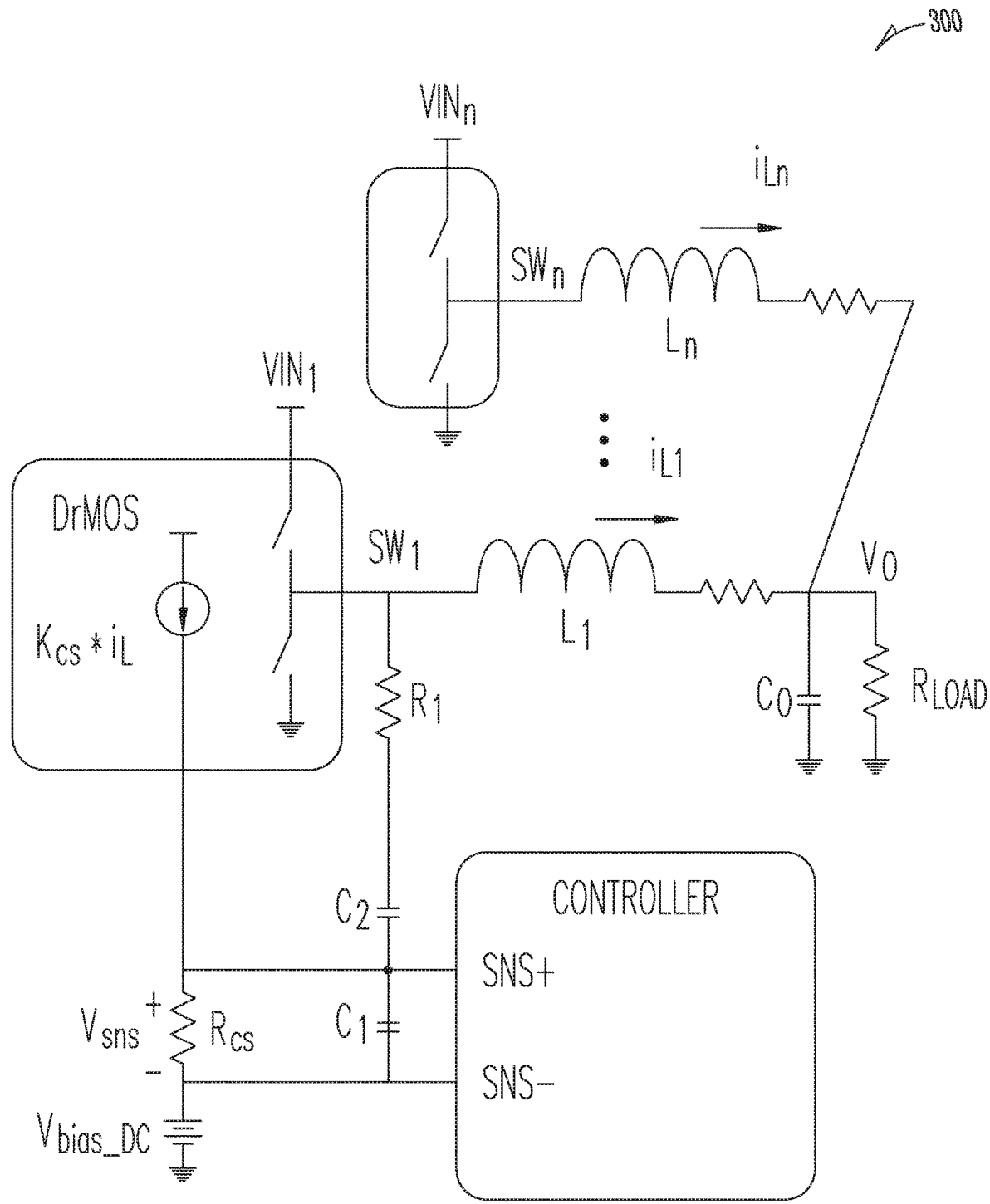
FIG. 3 is a circuit schematic of a multiphase switching converter circuit.

FIG. 3 is a circuit schematic of an example of a multiphase switching converter circuit 300. The circuit includes multiple power stages or phase stages that are activated and deactivated depending on the change in the load. The challenge to implement flat gain in current sensing becomes more difficult when using a multiphase switch converter.

Figure 4:
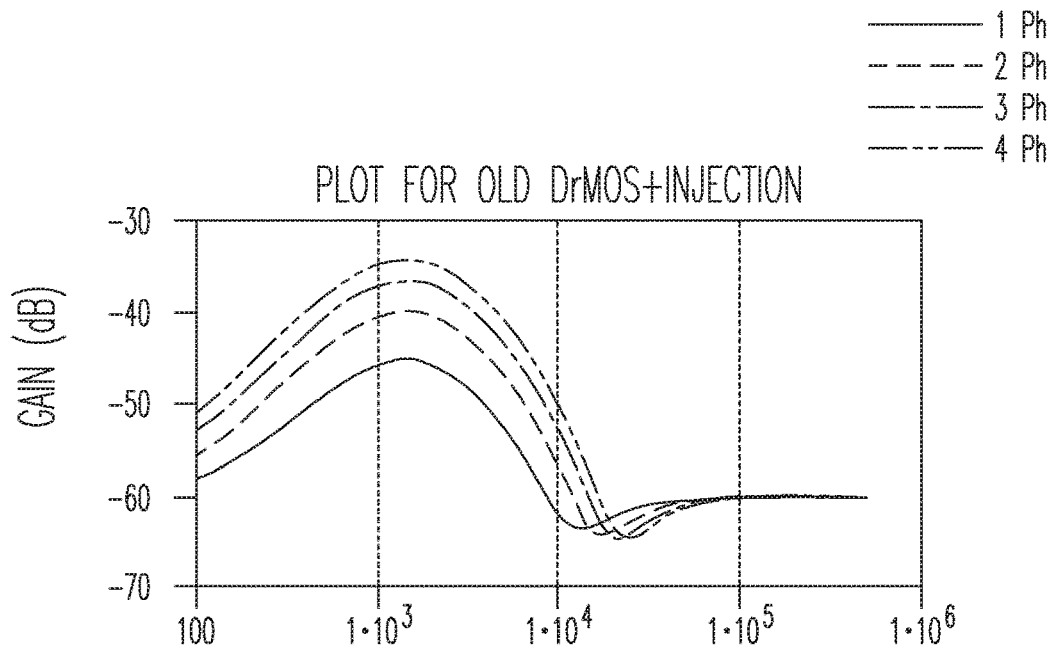
FIG. 4 shows Bode plots for the gain and phase of current sensing for the multiphase switch converter of FIG. 3.
Figure 4:
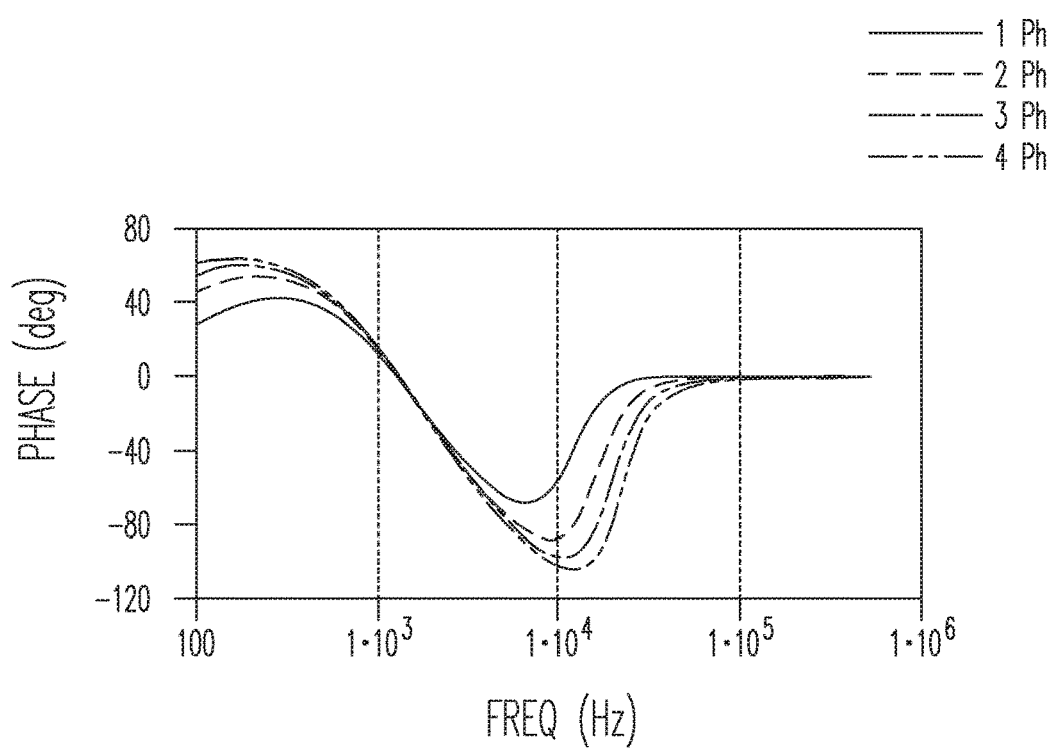

FIG. 4 shows Bode plots for the gain and phase of the current sensing for the multiphase switch converter of FIG. 3. The plots show that the current sensing gain is dependent on the number of active phases.

As explained previously herein, moving the corner frequency much higher than the resonant frequency of the power stage can provide a flat current sensing frequency response. However, in practice it is common that the noise from the current sensor is so strong that the corner frequency must be close to or lower than the power stage resonant frequency. Thus, it is difficult in practice to implement current sensing with a flat gain frequency response.

Figure 5:
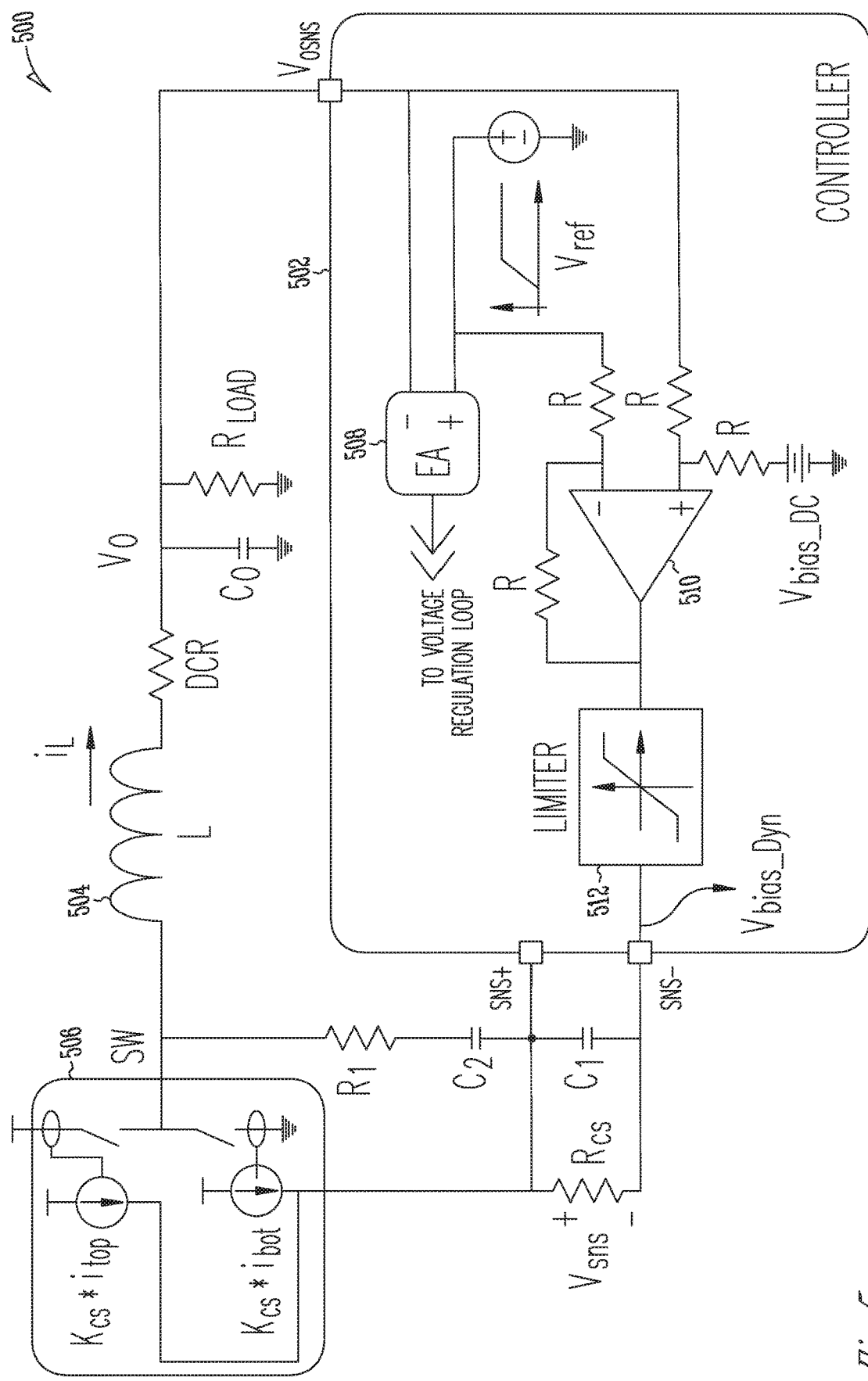
FIG. 5 is a circuit schematic of another example of a switching converter circuit.

FIG. 5 is a circuit schematic of a switching converter circuit 500 with improved frequency response over the example of FIG. 1. The switching converter circuit includes an inductive circuit element 504 that may be, among other things, a discrete inductor or an inductive device fabricated on an integrated circuit (IC). The switching converter circuit also includes a DrMOS switching circuit 506 that has top and bottom power devices (e.g., power FETs). The DrMOS control charges and discharges the inductive circuit element 504 to generate an output voltage $V_O$ to the circuit load $R_{LOAD}$. The output voltage $V_O$ is connected to the $V_{OSNS}$ pin of the controller 502. The $V_{OSNS}$ signal feeds to the inverting input of the voltage regulation loop error amplifier 508 that compares the sensed output voltage to voltage reference Vref connected to the noninverting input. The output of the error amplifier can be fed to a voltage regulation circuit loop that adjusts the switching of the DrMOS to regulate the output. The amplified error is fed to a pulse modulation (PWM) circuitry and other circuitry in the controller 502. During a soft start-up, the reference voltage ramps up to its final DC value smoothly, and closed loop feedback control adjusts switching of the DrMOS to force output voltage $V_O$ to track the reference voltage.

The switching converter circuit also includes a current sensing circuit to sense inductor current. The DrMOS sources a current proportional to the inductor current ($K_{CS} \cdot i_L$) and the sourced current is applied to a current sensing circuit element $R_{CS}$ to generate a voltage $V_{SNS}$ proportional to the sourced current and hence proportional to the inductor current $i_L$. Because the current sensed by the DrMOS is based on the on-resistance of the power FET, the sourced current ($K_{CS} \cdot i_L$) is a noisy signal and may have noise spikes, noise dips and signal delay. The sensed voltage $V_{SNS}$ is filtered and provided to the controller 502. Capacitor $C_1$ connected in parallel to $R_{CS}$ attenuates the noise in the sensed voltage $V_{SNS}$. The $R_1$-$C_2$ path supplies the high frequency component so that $V_{SNS}$ is an integrous representative of inductor current. $V_{SNS}$ can be used for over current protection, load limiting, or current mode pulse switch modulation (PWM) of the DrMOS control.

Because there are one or more active devices in the current source of the DrMOS, a bias circuit node of the current sensing circuit element $R_{CS}$ is biased to an intermediate common mode voltage above the low supply voltage (e.g., ground) and below the high supply voltage (e.g., $V_{CC}$) to provide headroom to the active device(s). However, the bias is not a DC bias to a common mode. Instead, the switching converter circuit includes a dynamic bias circuit that applies a dynamic bias voltage to the bias circuit node. The dynamic bias voltage includes an AC component $v_O(t)$ that is time varying and tracks the AC signal component of the output voltage $V_O$.

The output voltage $V_O$ also includes a DC signal component equal to a reference voltage Vref. This DC signal component is removed by the dynamic bias circuit. In the example of FIG. 5, the dynamic bias circuit includes a differential amplifier 510. The reference voltage Vref is applied to the inverting terminal of the amplifier 510 and sensed output voltage $V_{OSNS}$ is fed to the non-inverting input with a DC bias ($V_{bias\_DC}$). This removes Vref from $V_O$ while retaining the AC component and adding the new DC bias Vbias_DC. The dynamic bias voltage that is output by the differential amplifier is $$V_{bias\_Dyn}(t)=v_O(t)-V\text{ref}+V_{bias\_DC}.$$

The output of the differential amplifier 510 is connected to a signal limiter (e.g., a clamping circuit) to limit the amplitude of the dynamic bias voltage. The limiter 512 ensures that $V_{bias\_Dyn}(t)$ is within the bias voltage range required by the DrMOS current source.

The switching converter circuit 500 also includes a high pass filter coupled to the low pass filter $R_{CS}C_1$ and a switching circuit node (SW) connected to the inductive circuit element 504. The high pass filter includes resistor $R_1$ and capacitor $C_2$ connected in series. The high pass filter filters current injected into the current sensing input of the controller and the current sensing resistor $R_{CS}$.

Figure 6:
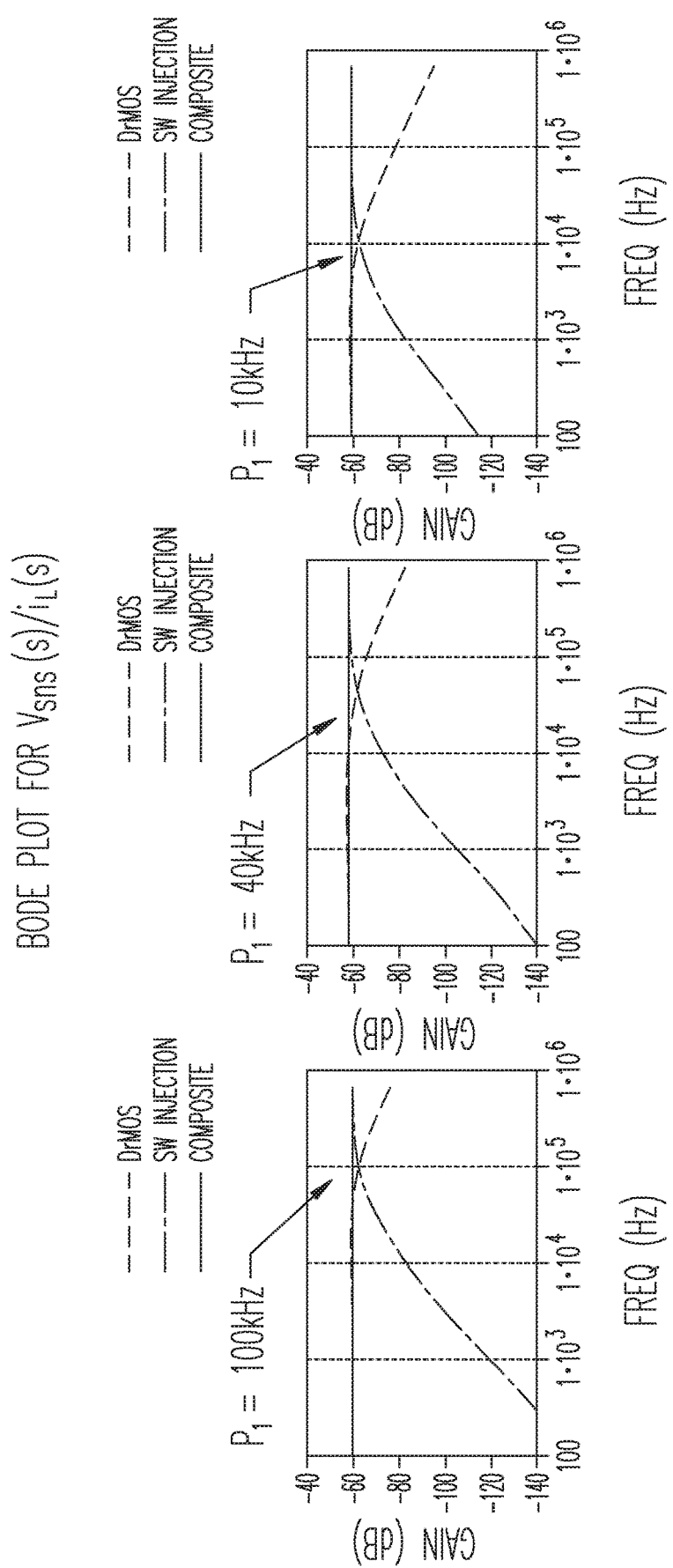
FIG. 6 shows graphs of Bode plots of the gain of the current sensing for the circuit example of FIG. 5.

FIG. 6 shows graphs of Bode plots of the gain of the current sensing ($V_{sns}(s)/i_L(s)$) for the circuit example of FIG. 5. The Bode plots show the frequency response of the low pass filtered current signal 604, the frequency response of the high pass filtered SW injection signal 606, and a composite frequency response 608 of the high pass and low pass filtering. Compared to the Bode plots of FIG. 2, the frequency response of the high pass filtered SW injection signal 606 does not include the notch. Consequently, the composite frequency response 608 of the gain is flat over the frequency range.

By using the dynamic bias voltage $V_{bias\_Dyn}(t)$, the low pass filter corner frequency is not limited by the resonant frequency of the power stage. Properly selection of the high pass filter component value can induce a proportional current sensing signal at and above the low pass filter corner frequency, even it is below the resonant frequency of the power stage. The dynamic bias voltage technique also provides a flat frequency response for the gain of the current sensing circuit for a multiphase switching converter circuit. In the example in FIG. 3, the connection of the current sensing circuit element to the DC bias is replaced with the connection to the dynamic bias circuit.

There is a clear physical reason why the dynamic bias technique overcome the limitation of the system with a DC bias. Above the crossover frequency fc, the current sensing signal relies on the signal from SW node injection since the current signal from the DrMOS is strongly attenuated. The voltage across the inductor is the voltage at the SW circuit node minus output voltage $V_O$. The dynamic of both signals determines the inductor current. In order to reflect the inductor current dynamic behavior, the signal from SW node injection couples to the same dynamic signals. With a DC bias voltage as in the example circuit of FIG. 1, the lower end of the injection branch connects to the DC bias voltage, so that the dynamic of $V_O$ is lost.

Figure 7:
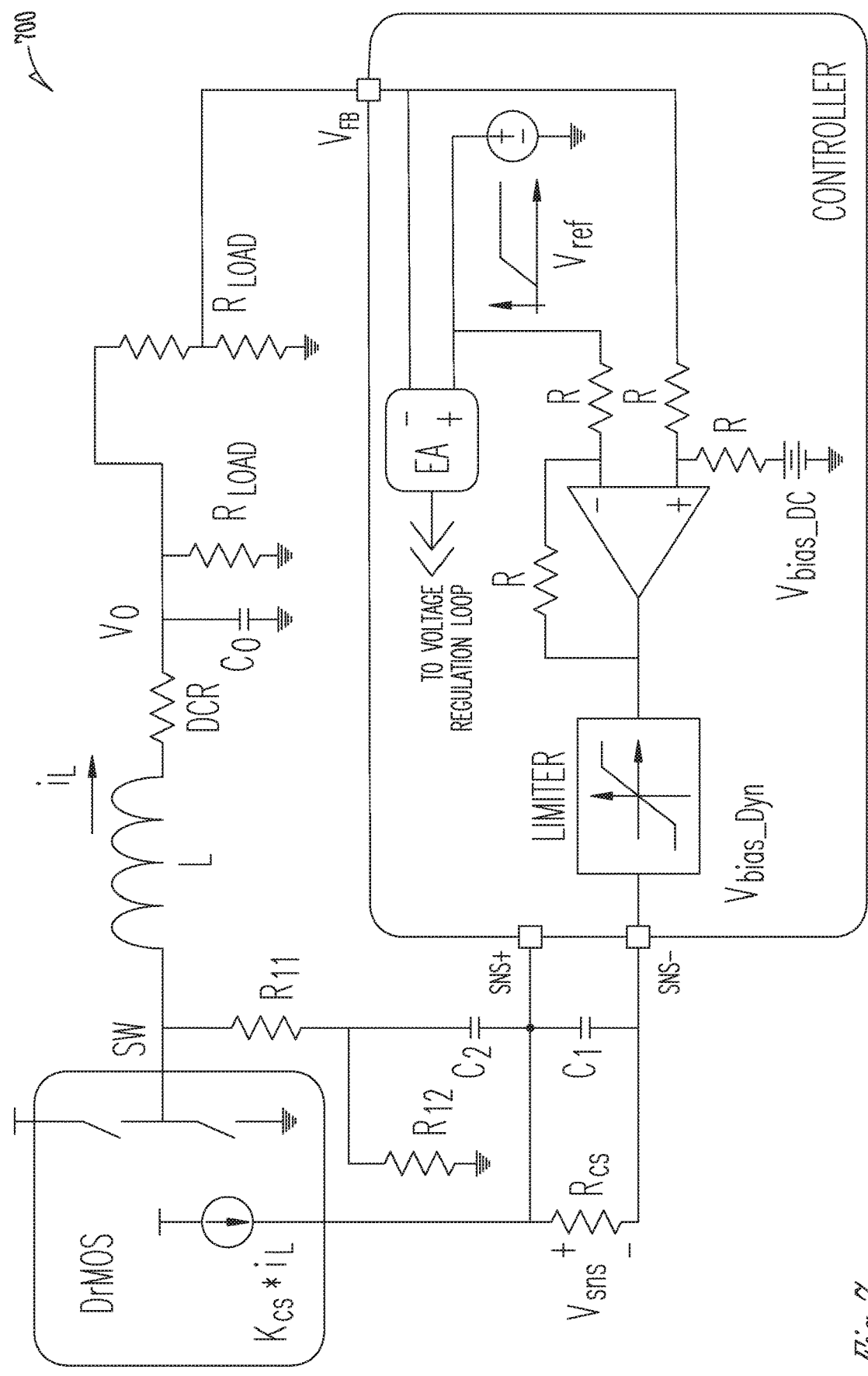
FIG. 7 is a circuit schematic of another example of a switching converter circuit.

FIG. 7 is a circuit schematic of another example of a switching converter circuit 700. The example is similar to the example if FIG. 5 except that the sensed output voltage $V_{FB}$ for regulation and biasing is a divided down version of output voltage $V_O$. The dynamic bias voltage that is output by the differential amplifier is $$V_{bias\_Dyn}(t)=k \cdot v_O(t)-V\text{ref}+V_{bias\_DC},$$

where k is the ratio of the dividing resistors.

Figure 8:
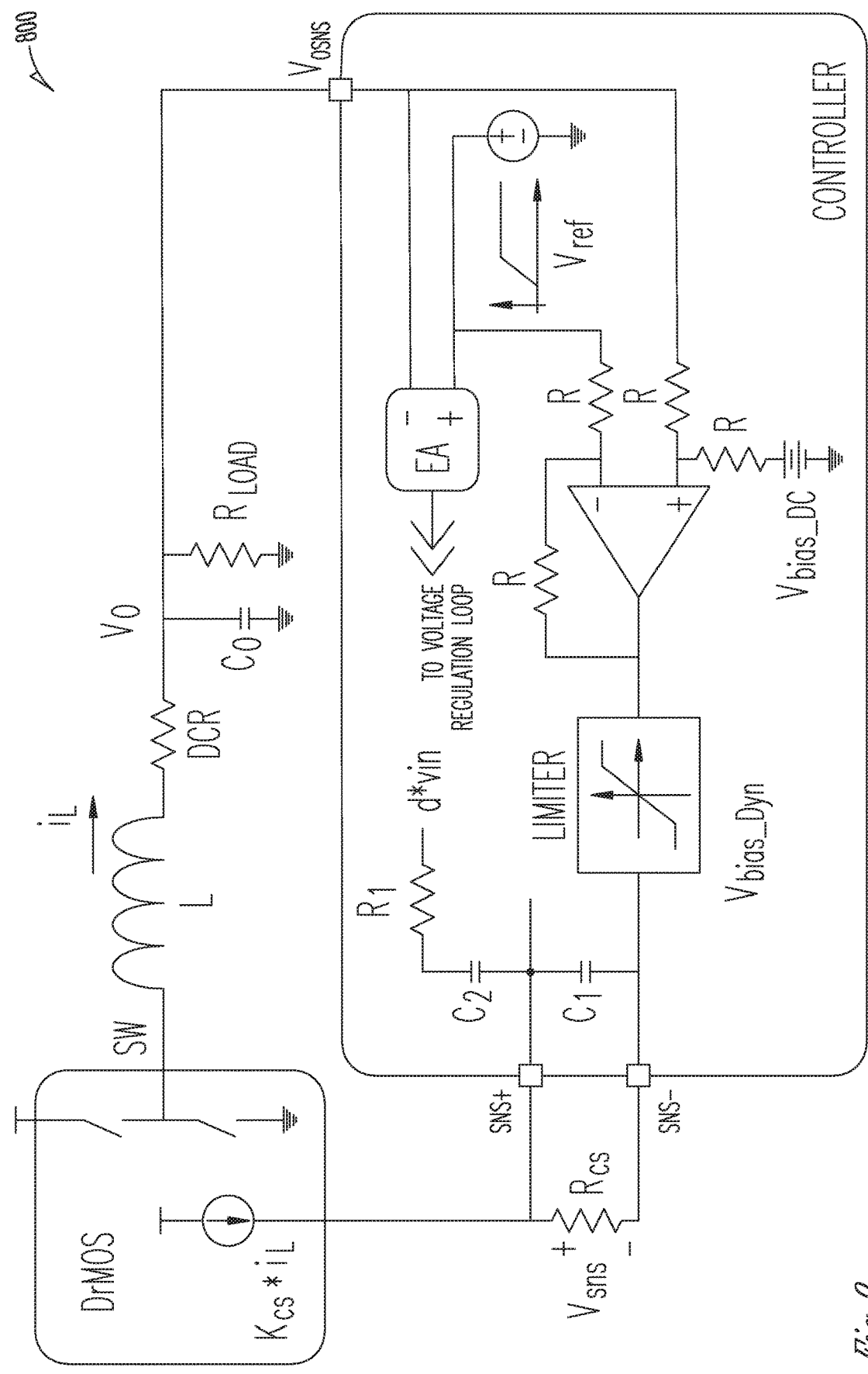
FIG. 8 is a circuit schematic of still another example of a switching converter circuit.

FIG. 8 is a circuit schematic of another example of a switching converter circuit. In this example, the injection signal is internal to the controller. This eliminates the connection to the SW circuit node and allows the capacitors $C_1$, $C_2$ and resistor $R_1$ to be internal to the controller. The duty cycle signal d is used for PWM and activates switching circuit elements of the DrMOS switching circuits to provide the regulated output voltage. The duty cycle signal d is the signal used as the injection signal that is high pass filtered and injected into the current sensing input of the controller and the current sensing resistor $R_{CS}$.

Figure 9:
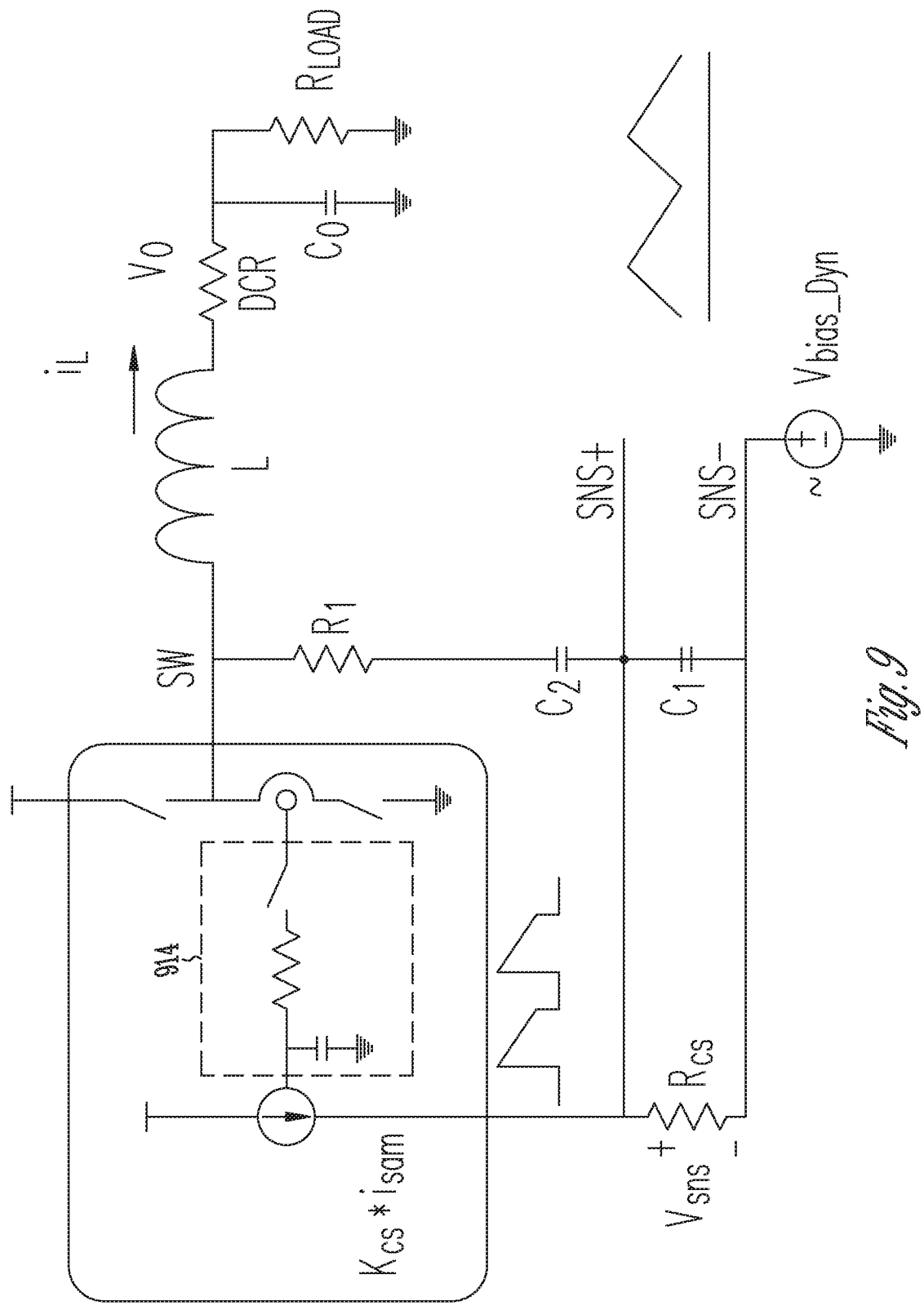
FIG. 9 is a circuit schematic of a further example of a switching converter circuit.

FIG. 9 is a circuit schematic of another example of a switching converter circuit. The switching converter circuit is a buck converter circuit. The controller is not shown in the example, but the controller receives sensed voltage $V_{SNS}$ at inputs SNS+ and SNS−. The dynamic bias circuit is shown as voltage source $V_{bias\_Dyn}$. In the example of FIG. 9, only the current of the bottom side power FET is sensed.

For a high frequency switching small duty cycle Buck converter, the on-time of the top side switch is short. With the reverse recovery and other switching noise, it is difficult to provide an accurate current signal during the on time of the top side FET. This is true even for an average measurement because an overstated or understated current sense signal may distort the average current reading. Moreover, the top side switch current sensing is much more complicated to implement in hardware because it is a flying circuit.

It is feasible to sense just the bottom FET average current to represent the average inductor current. The average current of the bottom FET can be obtained by averaging the signal during bottom FET on-time, or sampling at the middle of the bottom FET on-time.

The current sensing circuit includes a sample and hold circuit 914 that samples the current of the bottom FET to generate a sampled current sense signal ($K_{CS} \cdot i_{SAM}$). The sampled current signal is applied to the current sensing circuit element and the sample and hold circuit tracks the low frequency signal. The low pass filter circuit filters the sampled current sense signal. The current injection from the SW circuit node provides the high frequency signal component as before.

Figure 10:
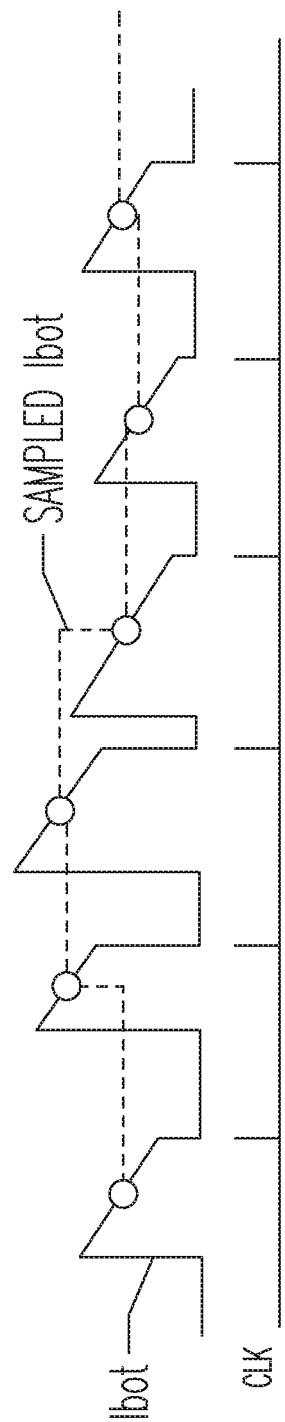
FIG. 10 is an illustration of an example of sampling the current of a bottom side power device of a driver circuit of a switching converter circuit.

FIG. 10 is an illustration of an example of sampling the current (Ibot) of the bottom side FET. The illustration shows that the current is sampled in the middle of the on time of the bottom side FET. Although the sampling effect limits the usable bandwidth of this average signal to far below 1/10 of switching frequency, with the proposed technique, the effective high frequency injection can make up a real time current sensing signal.

Figure 11:
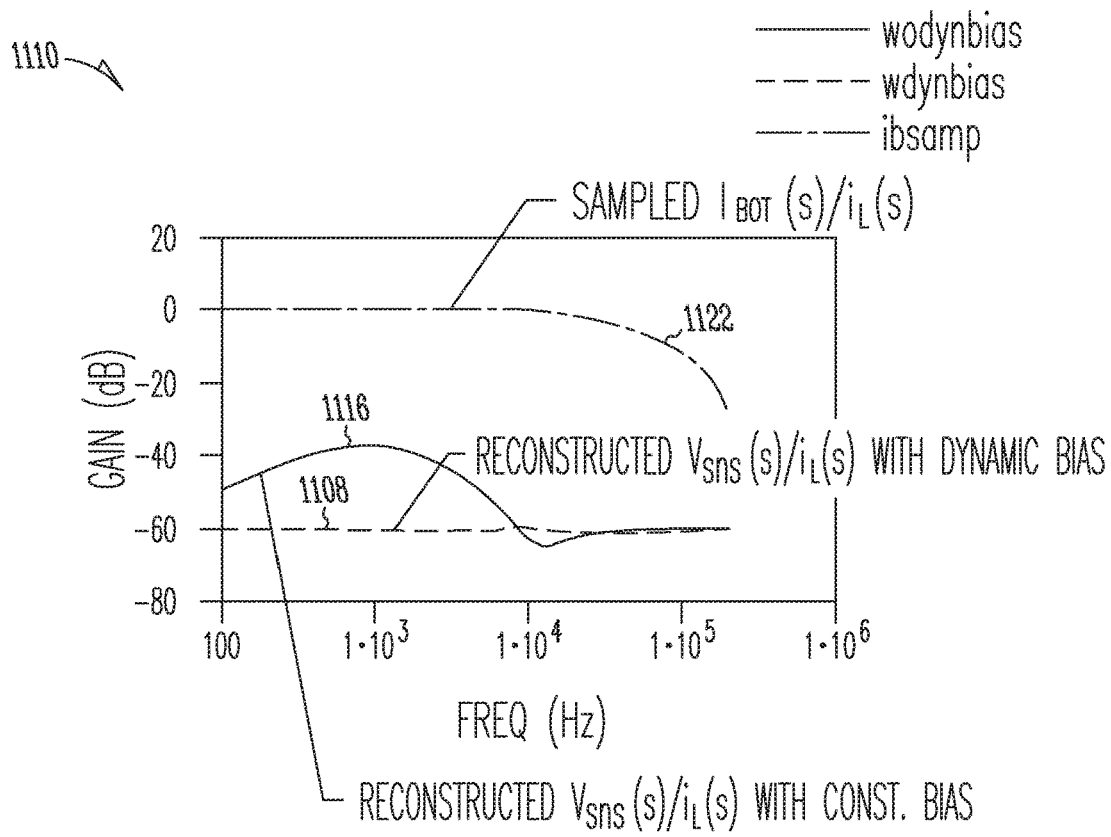
FIG. 11 shows Bode plots of the gain and phase of the current sensing for the circuit example of FIG. 9.
Figure 11:
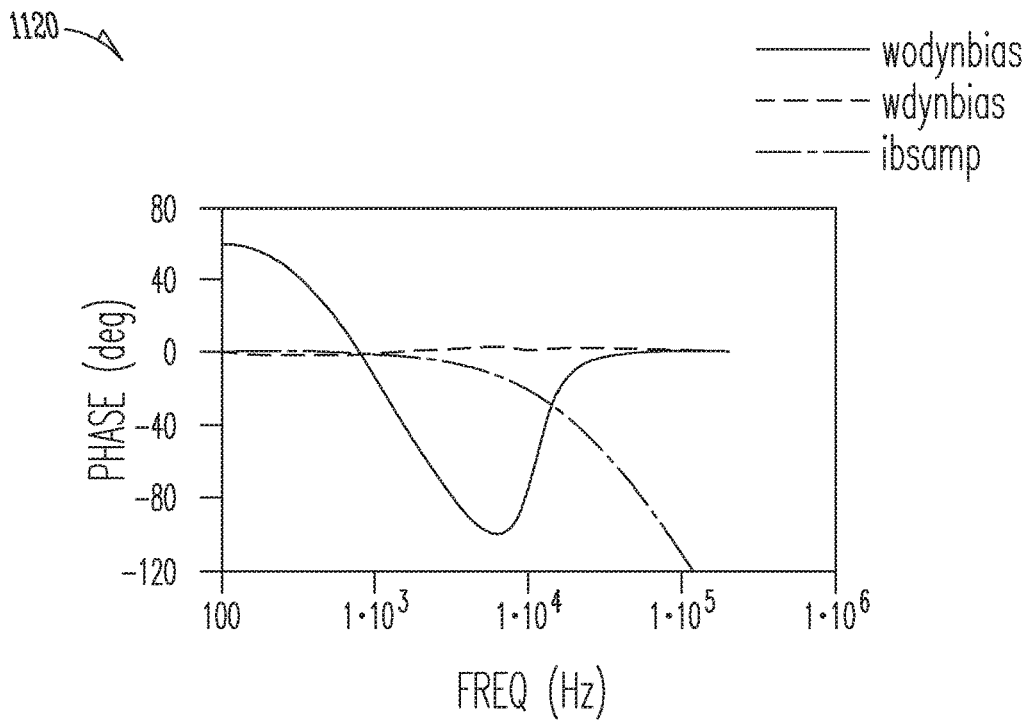

FIG. 11 shows a Bode plot 1110 of the gain of the current sensing and a Bode plot 1120 of the phase of the current sensing for the circuit example of FIG. 9. The phase Bode plot 1120 shows that the sampled and filtered average current signal exhibits significant delay due to sampling effect. The gain Bode plot 1110 shows the frequency response 1122 of the low frequency signal of the of the sampled bottom side FET current ($I_{BOT}(s)/i_L(s)$). The sampled bottom side FET current is combined with the high pass filtered SW injection signal and with the dynamic bias to reconstruct the current sensing signal ($V_{sns}(s)/i_L(s)$). Graph 1108 shows the gain of the current sensing signal reconstructed with a dynamic bias voltage and graph 1106 shows the gain of the current sensing signal reconstructed with a constant bias voltage. The Bode plot 1110 shows that the gain of the frequency response of the current sensing with the dynamic bias voltage is flat over the frequency range.

Figure 12:
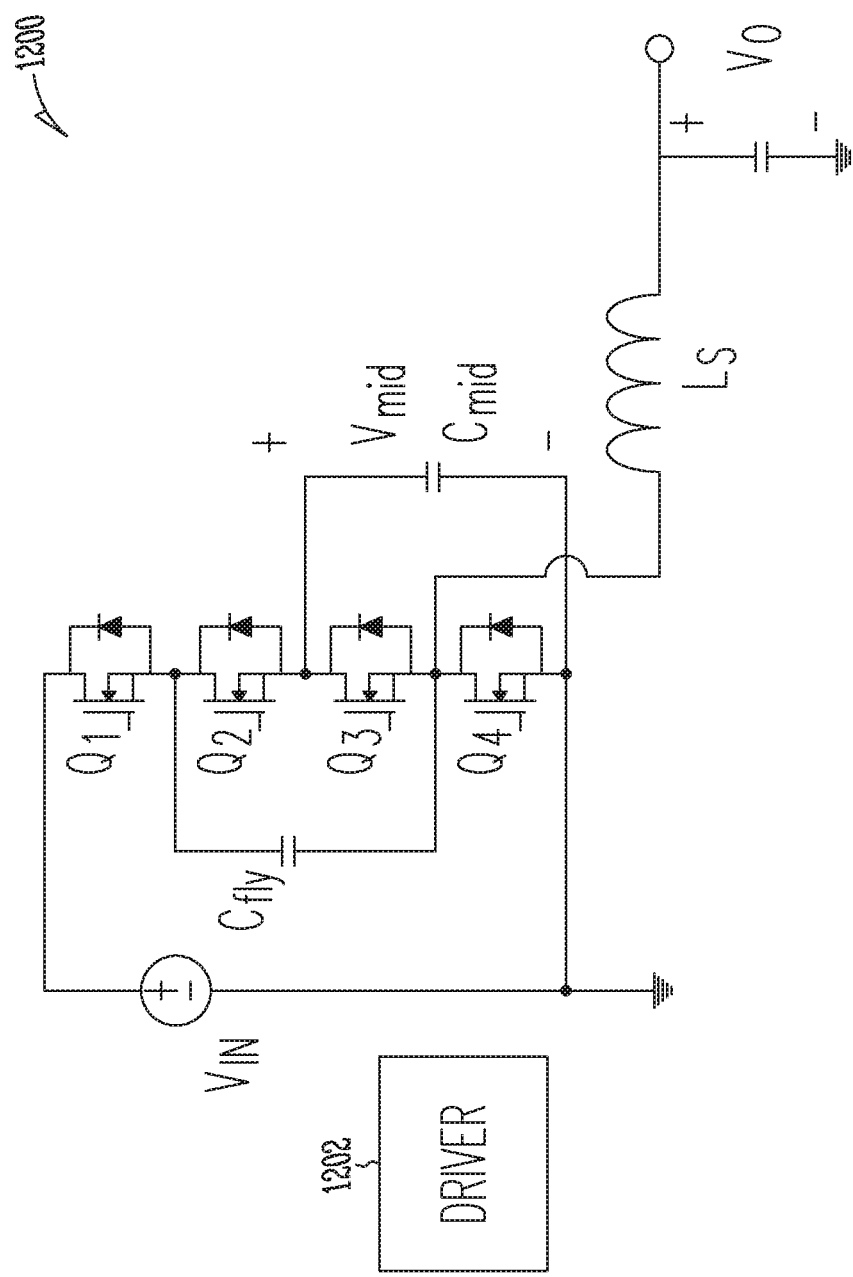
FIG. 12 is a circuit schematic of a hybrid switched capacitor pule width modulation step down voltage regulator.

FIG. 12 is a circuit schematic of a hybrid switched capacitor PWM step down voltage regulator 1200. A hybrid switch capacitor PWM regulator has higher power conversion efficiency than the switching converter circuits of the examples described previously herein, especially for high voltage high frequency applications. The hybrid switch capacitor PWM regulator includes a charge pump circuit stage and a power stage. The charge pump circuit includes four switching transistors ($Q_1$, $Q_2$, $Q_3$, $Q_4$) connected in series, a midpoint capacitor $C_{MID}$ and a flying capacitor $C_{FLY}$. There are three switching circuit nodes ($SW_1$, $SW_2$, $SW_3$) between the switching transistors. The power stage includes inductor L connected to $SW_3$ and $C_{FLY}$.

A driver circuit 1202 controls activation of the switching transistors to generate an output voltage $V_O$ at the output terminal connected to the load $R_{LOAD}$. The driver circuit 1202 may use voltage regulation to adjust a switching duty cycle of the switching transistors to generate a regulated output voltage. The driver circuit activates the switching transistors in pairs with one of the high side transistors activated with one of the low side transistors. During an active stage devices $Q_1$ and $Q_3$ are on, and in a freewheeling stage devices $Q_2$ and $Q_4$ are on.

Figure 13:
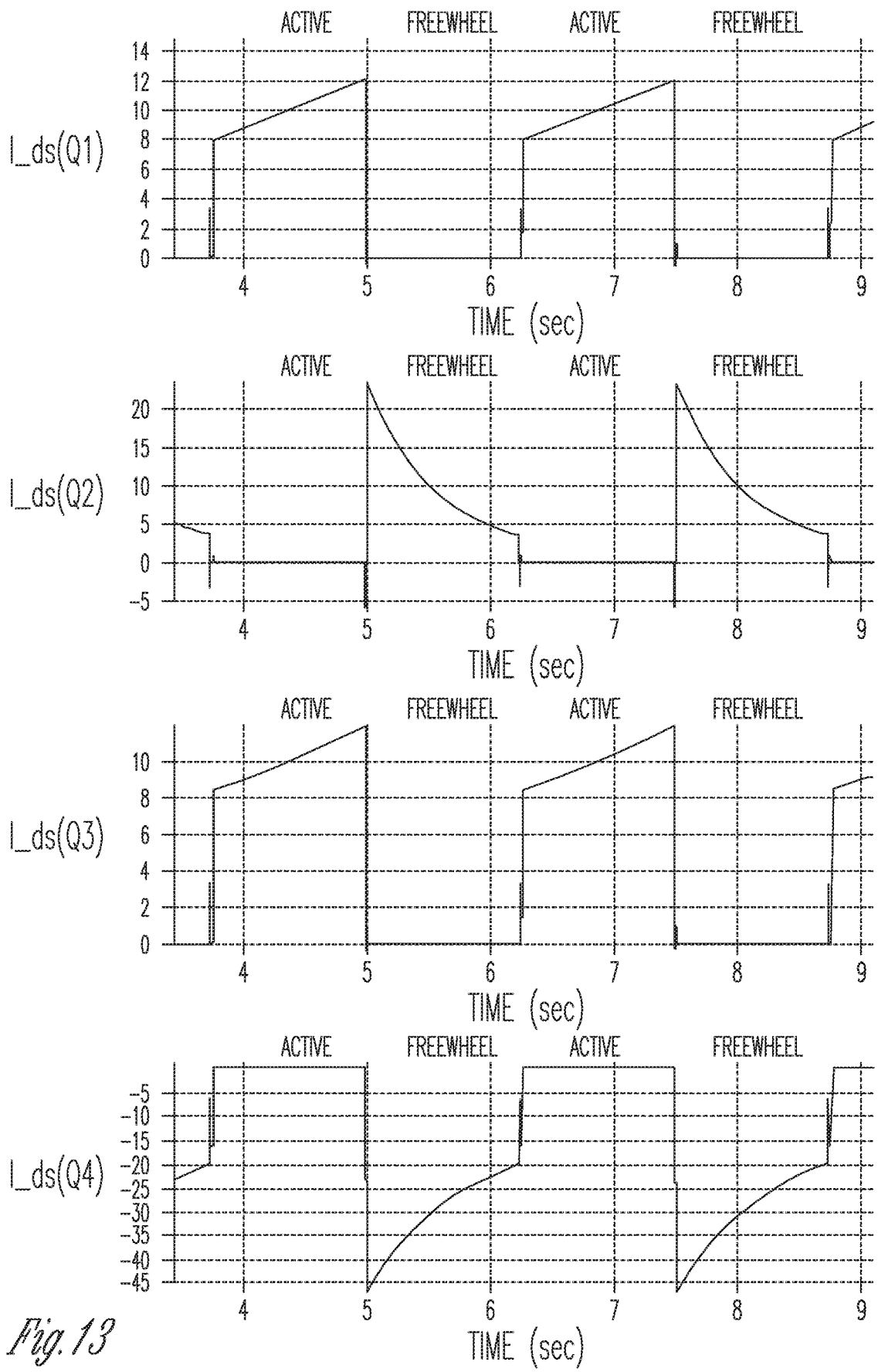
FIG. 13 is a graph showing the drain to source (Ids) current waveforms for switching transistors of the circuit of FIG. 12.

FIG. 13 is a graph showing the drain to source (Ids) current waveforms in the switching transistors during the active stage and the freewheeling stage. During the active stage, the inductor current ($i_L$) is the sum of the $Q_1$ current and the $Q_3$ current, or $$i_L(t)|_{active} = i_{ds\_Q1}(t) + i_{ds\_Q3}(t).$$

It should be noted that the current distribution can be unequal, which is dependent on the $C_{FLY}$ and $C_{MID}$ design. So, sensing only the $Q_1$ current or the $Q_3$ current cannot infer the inductor current signal.

During the freewheeling stage, the inductor current is the $Q_4$ current minus the $Q_2$ current, or $$i_L(t)|_{freewheel} = -i_{ds\_Q4}(t) - i_{ds\_Q2}(t).$$

Figure 14:
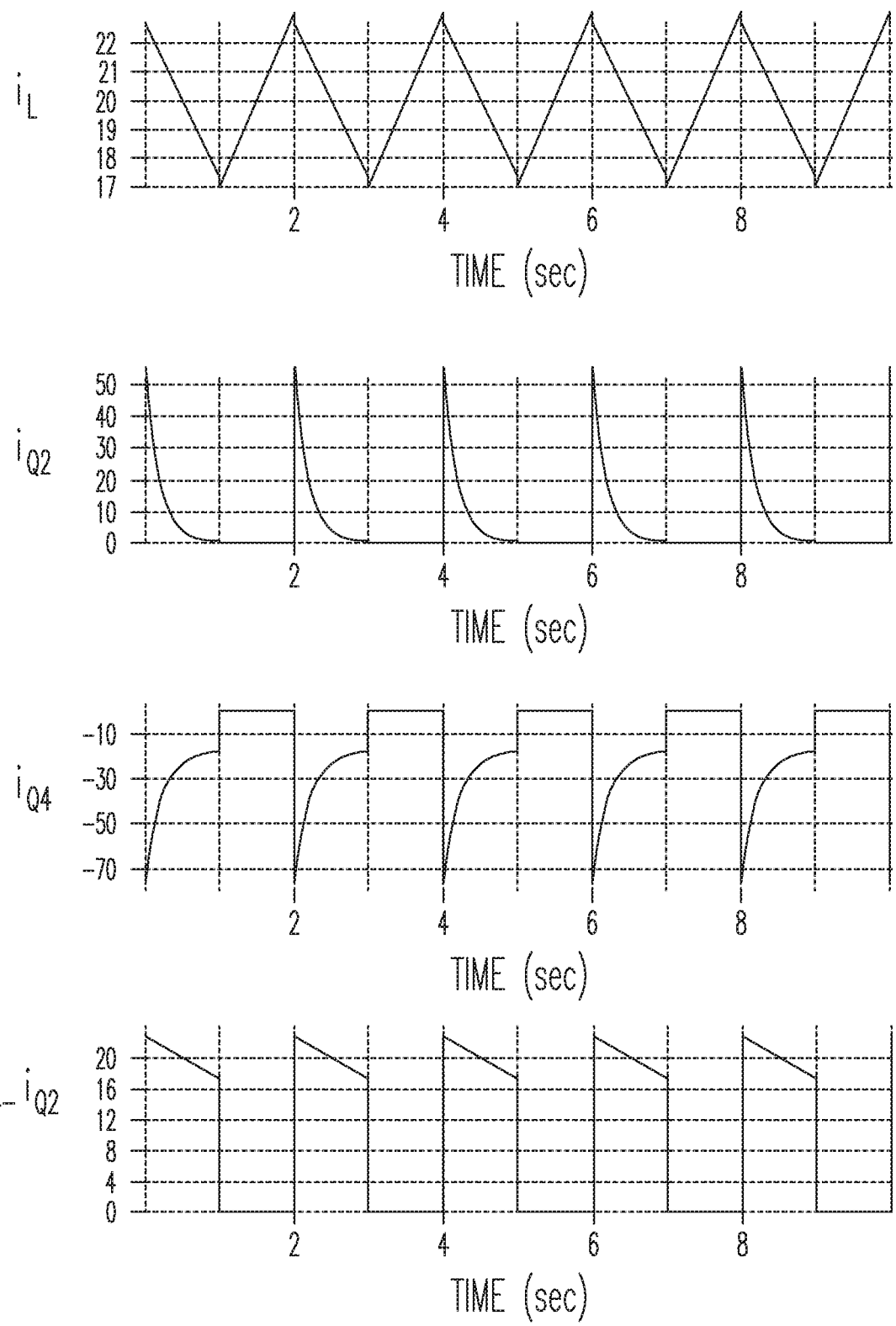
FIG. 14 shows current waveforms of the inductor current and switching transistors of the circuit of FIG. 12.

FIG. 14 shows waveforms of the inductor current ($i_L$), $Q_2$ current ($i_{Q2}$), $Q_4$ current (i), and $Q_4$–$Q_2$ current ($i_{Q4}-i_{Q2}$). During the freewheeling period when Q2 and Q4 are on, it can be seen in the waveforms that the inductor current is equal to the $Q_4$ current minus the $Q_2$ current.

In some special cases, if the $Q_2$ current is small and negligible, the $Q_4$ current is equal to the inductor current. These special cases include but are not limited to: i) the flying capacitor and mid capacitor being large enough so that the $Q_2$ current is small; ii) the on resistance of the FETs being small so that by the middle of the on-time of $Q_2$ and $Q_4$, the $Q_2$ current has decayed to a negligible value; and iii) topology improvements that reduce $Q_2$ to a small value.

The hybrid switched capacitor converter has multiple floating power MOSFETs. Compared to the simple Buck converter, transferring and summing the sensed current signals of the multiple floating MOSFETs is more complicated. This is especially true for $Q_1$ and $Q_3$ because these switching transistors are "flying" switches. Because transistor $Q_2$ sits on the stable voltage $V_{MID}$ of $C_{MID}$, and $Q_4$ refers to ground, the current sensing of $Q_2$ and $Q_4$ (or only $Q_4$ in a special case) is easier.

By using a current sensing circuit with a sample and hold circuit and a dynamic bias circuit as in the example of FIG. 9, one can sense the average total current of $Q_1$ and $Q_3$ during active stage, or preferably, the average total current of $Q_2$ and $Q_4$ during freewheeling stage, and use the sampled signal as the low frequency inductor current signal. Beyond the crossover frequency, the high frequency injection signal takes over for the current sensing signal. The inductor current is reconstructed the sampled low frequency current signal and the high frequency injection current signal.

Figure 15:
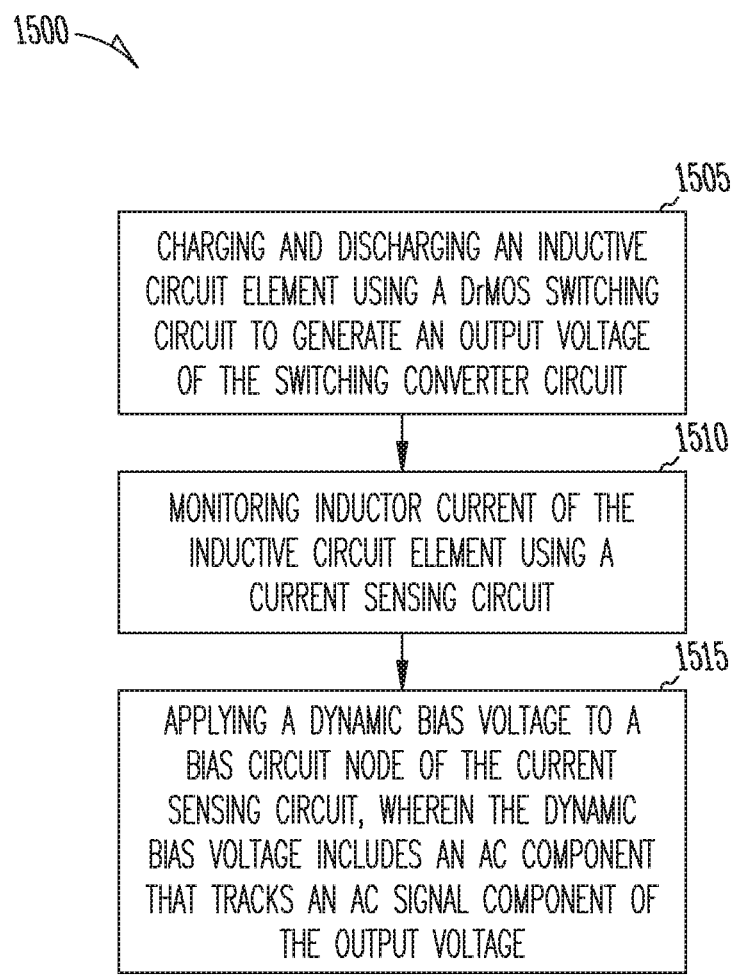
FIG. 15 is a flow diagram of an example of a method of operating a switching converter circuit.

FIG. 15 is a flow diagram of an example of a method 1500 of operating a switching converter circuit, such as any of the switching converter circuits described herein for example. At block 1505, an inductive circuit element is charged and discharged using a driver circuit to generate an output voltage of the switching converter circuit. The driver circuit may be a DrMOS switching circuit.

At 1510, the inductor current is monitored using a current sensing circuit. The current sensed may be sourced by the driver circuit. In some aspects, the driver circuit sources a current signal that is low pass filtered by the current sensing circuit and a current signal from a switching node is high pass filtered and summed with the low pass filtered signal by injection into a circuit element of the current sensing circuit. In some aspects, the current signal provided by the driver circuit is sampled and indictor current is inferred by reconstructing the inductor current using the sampled low pass filtered current signal and the high pass filtered current signal.

At 1515, a dynamic bias voltage is applied to a bias circuit node of the current sensing circuit. The dynamic bias voltage includes AC component that tracks an AC signal component of the output voltage. A DC bias component is added to the AC component to provide headroom to devices sourcing the current for monitoring.

The several examples of systems, devices, and methods described can be used to monitor inductor current for switched mode power converters and hybrid switched capacitor converters. The current sensing is accurate, is provided in real time, and is robust to signal noise.

ADDITIONAL DESCRIPTION AND ASPECTS

A first Aspect (Aspect 1) includes subject matter (such as a switching converter circuit) comprising an inductive circuit element, a driver switching circuit configured to provide energy to the inductive circuit element to generate an output voltage that has an alternating current (AC) signal component and a direct current (DC) signal component, a current sensing circuit coupled to a bias circuit node and configured to generate a current sense signal representative of inductor current of the inductive circuit element, and a dynamic bias circuit configured to apply a dynamic bias voltage to the bias circuit node, and the dynamic bias voltage includes an AC component that tracks the AC signal component of the output voltage.

In Aspect 2, the subject matter of Aspect 1 optionally includes a dynamic bias circuit configured to separate the DC signal component of the output voltage from the AC signal component of the output voltage and add a DC bias component to the AC signal component to generate the dynamic bias voltage.

In Aspect 3, the subject matter of Aspect 2 optionally includes an error amplifier configured to compare a sensed output voltage to a reference voltage, and a dynamic bias circuit that includes a differential amplifier configured to subtract the reference voltage from the output voltage, add the DC bias component, and retain the AC signal component to generate the dynamic bias voltage.

In Aspect 4, the subject matter of one or any combination of Aspects 1-3 optionally includes a clamping circuit configured to limit the amplitude of the dynamic bias circuit.

In Aspect 5, the subject matter of one or any combination of Aspects 1-4 optionally includes a current sensing circuit element included in the current sensing circuit and configured to generate a sensed voltage representative of the inductor current, a low pass filter circuit configured to filter the sensed voltage, and a high pass filter circuit operatively coupled to the low pass filter circuit and a switching circuit node operatively coupled to the inductive circuit element.

In Aspect 6, the subject matter of one or any combination of Aspects 1-4 optionally includes a current sensing circuit element included in the current sensing circuit and configured to generate a sensed voltage signal representative of the inductor current, a low pass filter circuit configured to filter the sensed voltage signal, aa voltage regulating circuit loop configured to monitor the output voltage and generate a duty cycle signal to activate switching circuit elements of the driver switching circuit to provide a regulated output voltage, and a high pass filter circuit configured to apply a high pass filtered duty cycle signal to the current sensing element.

In Aspect 7, the subject matter of one or any combination of Aspects 1-4 optionally includes a low pass filter circuit, a high pass filter circuit operatively coupled to the low pass filter circuit and a switching circuit node operatively coupled to the inductive circuit element, and a current sensing circuit that includes a sample and hold circuit configured to generate a sampled current sense signal of current in a switching circuit element of the driver switching circuit, and the low pass filter circuit is configured to filter the sampled current sense signal.

Aspect 8 includes subject matter (such as a method of operating a switching converter circuit) or can optionally be combined with one or any combination of Aspects 1-7 to include such subject matter, comprising charging and discharging an inductive circuit element using a driver and MOSFET (DrMOS) switching circuit to generate an output voltage of the switching converter circuit, monitoring inductor current of the inductive circuit element using a current sensing circuit, and applying a dynamic bias voltage to a bias circuit node of the current sensing circuit, wherein the dynamic bias voltage includes an alternating current (AC) component that tracks an AC signal component of the output voltage.

In Aspect 9, the subject matter of Aspect 8 optionally includes removing a direct current (DC) signal component of the output voltage to generate the AC component of the dynamic bias voltage and adding a DC bias component to the AC component of the dynamic bias voltage.

In Aspect 10, the subject matter of Aspect 9 optionally includes regulating the output voltage by comparing the output voltage to a voltage reference using an error amplifier, subtracting the reference voltage from the output voltage.

In Aspect 11, the subject matter of one or any combination of Examples 8-10 optionally includes limiting the amplitude of the dynamic bias voltage using a clamping circuit.

In Aspect 12, the subject matter of one or any combination of Examples 8-11 optionally includes sensing the inductor current by sensing a voltage of a current sensing circuit element, and filtering the sensed voltage using a low pass filter circuit, and applying current from a switching circuit node connected to the inductive circuit element to the current sensing circuit element and filtering the current using a high pass filter circuit.

In Aspect 13, the subject matter of one or any combination of Aspects 8-12 optionally includes activating switching circuit elements of the DrMOS switching circuit according to a duty cycle signal to generate the output voltage, sensing the inductor current by sensing a voltage of a current sensing circuit element and filtering the sensed voltage using a low pass filter circuit, and applying the duty cycle signal to the current sensing element and filtering the duty cycle signal using a high pass filter circuit.

In Aspect 14, the subject matter of one or any combination of Aspects 8-14 optionally includes sensing the inductor current by sampling current of a switching circuit element of the DrMOS switching circuit connected to the inductive circuit element to generate a sampled signal, and filtering the sampled signal using a low pass filter circuit, and applying current from the switching circuit node connected to the inductive circuit element to the current sensing element and filtering the current using a high pass filter circuit.

Aspect 15 includes subject matter (such as a voltage converter circuit) or can optionally be combined with one or any combination of Aspects 1-14 to include such subject matter, comprising a charge pump circuit including multiple switching transistors connected in series, an inductive circuit element coupled to a first switching circuit node between a first low side switching transistor and a second high side switching transistor of the multiple switching transistors, a driver circuit configured to control activation of the multiple switching transistors to generate an output voltage at an output terminal of the voltage converter circuit, the output voltage having an alternating current (AC) signal component and a direct current (DC) signal component, a current sensing circuit to generate a current sense signal representative of inductor current of the inductive circuit element, wherein the current sensing circuit is coupled to a bias circuit node, and a dynamic bias circuit configured to apply a dynamic bias voltage to the bias circuit node, wherein the dynamic bias voltage includes an AC component that tracks the AC signal component of the output voltage.

In Aspect 16, the subject matter of Aspect 15 optionally includes a current sensing circuit that includes a sample and hold circuit coupled to the low side switching transistor and configured to generate a sampled current sense signal of current in the low side switching transistor.

In Aspect 17, the subject matter of Aspect 16 optionally includes a low pass filter circuit configured to filter the sampled current sense signal, and a high pass filter circuit operatively coupled to the low pass filter circuit and the switching circuit node.

In Aspect 18, the subject matter of one or any combination of Aspects 15-17 optionally includes a dynamic bias circuit configured to remove the DC signal component from a feedback output voltage and add a DC bias component to the AC signal component of the feedback output voltage to generate the dynamic bias voltage.

In Aspect 19, the subject matter of one or any combination of Aspects 15-18 optionally includes a clamping circuit configured to limit the amplitude of the dynamic bias circuit.

In Aspect 20, the subject matter of one or any combination of Aspects 15 and 18-19 optionally includes a current sensing circuit element included in the current sensing circuit and configured to generate a sensed voltage signal representative of the inductor current, a low pass filter circuit configured to filter the sensed voltage signal, and a high pass filter circuit operatively coupled to the low pass filter circuit and a switching circuit node operatively coupled to the inductive circuit element.

These several Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A switching converter circuit comprising:
   an inductive circuit element;
   a driver switching circuit configured to provide energy to the inductive circuit element to generate an output voltage of the switching converter circuit, the output voltage having an alternating current (AC) signal component and a direct current (DC) signal component
   a current sensing circuit configured to generate a current sense signal representative of inductor current of the inductive circuit element, wherein an output of the current sensing circuit is coupled to a bias circuit node;
   a dynamic bias circuit configured to apply a dynamic bias voltage to the bias circuit node, wherein the dynamic bias voltage includes an AC component that tracks the AC signal component of the output voltage; and
   an error amplifier configured to compare a sensed output voltage to a reference voltage; and wherein the dynamic bias circuit includes a differential amplifier configured to subtract the reference voltage from the output voltage, retain the AC signal component, and add a DC bias component to the AC signal component to generate the dynamic bias voltage.

2. The switching converter circuit of claim 1, including a clamping circuit configured to limit the amplitude of the dynamic bias circuit.

3. The switching converter circuit of claim 1, including:
a current sensing circuit element included in the current sensing circuit and configured to generate a sensed voltage representative of the inductor current;
a low pass filter circuit configured to filter the sensed voltage; and
a high pass filter circuit operatively coupled to the low pass filter circuit and a switching circuit node operatively coupled to the inductive circuit element.

4. The switching converter circuit of claim 1, including:
a current sensing circuit element included in the current sensing circuit and configured to generate a sensed voltage signal representative of the inductor current;
a low pass filter circuit configured to filter the sensed voltage signal;
a voltage regulating circuit loop configured to monitor the output voltage and generate a duty cycle signal to activate switching circuit elements of the driver switching circuit to provide a regulated output voltage; and
a high pass filter circuit configured to apply a high pass filtered duty cycle signal to the current sensing element.

5. The switching converter circuit of claim 1, including:
a low pass filter circuit;
a high pass filter circuit operatively coupled to the low pass filter circuit and a switching circuit node operatively coupled to the inductive circuit element; and
wherein the current sensing circuit includes a sample and hold circuit configured to generate a sampled current sense signal of current in a switching circuit element of the driver switching circuit, and the low pass filter circuit is configured to filter the sampled current sense signal.

6. A method of operating a switching converter circuit, the method comprising:
charging and discharging an inductive circuit element using a driver and MOSFET (DrMOS) switching circuit to generate an output voltage of the switching converter circuit;
monitoring inductor current of the inductive circuit element using a current sensing circuit;
regulating the output voltage by comparing the output voltage to a voltage reference using an error amplifier;
subtracting the reference voltage from the output voltage to generate an alternating current (AC) component for a dynamic bias voltage; and
adding a DC bias component to the AC component of the dynamic bias voltage to generate the dynamic bias voltage; and
applying the dynamic bias voltage to a bias circuit node of the current sensing circuit.

7. The method of claim 6, including limiting the amplitude of the dynamic bias voltage using a clamping circuit.

8. The method of claim 6, including:
sensing the inductor current by sensing a voltage of a current sensing circuit element, and filtering the sensed voltage using a low pass filter circuit; and
applying current from a switching circuit node connected to the inductive circuit element to the current sensing circuit element and filtering the current using a high pass filter circuit.

9. The method of claim 6, including:
activating switching circuit elements of the DrMOS switching circuit according to a duty cycle signal to generate the output voltage;
sensing the inductor current by sensing a voltage of a current sensing circuit element, and filtering the sensed voltage using a low pass filter circuit; and
applying the duty cycle signal to the current sensing element and filtering the duty cycle signal using a high pass filter circuit.

10. The method of claim 6, including:
sensing the inductor current by sampling current of a switching circuit element of the DrMOS switching circuit connected to the inductive circuit element to generate a sampled signal, and filtering the sampled signal using a low pass filter circuit; and
applying current from the switching circuit node connected to the inductive circuit element to the current sensing element and filtering the current using a high pass filter circuit.

11. A voltage converter circuit including:
a charge pump circuit including multiple switching transistors connected in series;
an inductive circuit element coupled to a first switching circuit node between a first low side switching transistor and a second high side switching transistor of the multiple switching transistors;
a driver circuit configured to control activation of the multiple switching transistors to generate an output voltage at an output terminal of the voltage converter circuit, the output voltage having an alternating current (AC) signal component and a direct current (DC) signal component;
a current sensing circuit to generate a current sense signal representative of inductor current of the inductive circuit element, wherein the current sensing circuit is coupled to a bias circuit node; and
a dynamic bias circuit configured to apply a dynamic bias voltage to the bias circuit node, wherein the dynamic bias voltage includes an AC component that tracks the AC signal component of the output voltage, wherein the dynamic bias circuit includes a differential amplifier configured to subtract the reference voltage from the output voltage, retain the AC signal component, and add a DC bias component to the AC signal component to generate the dynamic bias voltage.

12. The voltage converter circuit of claim 11, wherein the current sensing circuit includes a sample and hold circuit coupled to the low side switching transistor and configured to generate a sampled current sense signal of current in the low side switching transistor.

13. The voltage converter circuit of claim 12, including:
a low pass filter circuit configured to filter the sampled current sense signal; and
a high pass filter circuit operatively coupled to the low pass filter circuit and the switching circuit node.

14. The voltage converter circuit of claim 11, wherein the dynamic bias circuit is configured to remove the DC signal component from a feedback output voltage and add the DC bias component to the AC signal component of the feedback output voltage to generate the dynamic bias voltage.

15. The voltage converter circuit of claim 11, including a clamping circuit configured to limit the amplitude of the dynamic bias circuit.

16. The voltage converter circuit of claim 11, including:
a current sensing circuit element included in the current sensing circuit and configured to generate a sensed voltage signal representative of the inductor current;
a low pass filter circuit configured to filter the sensed voltage signal; and
a high pass filter circuit operatively coupled to the low pass filter circuit and a switching circuit node operatively coupled to the inductive circuit element.

* * * * *

UNITED STATES PATENT AND TRADEMARK OFFICE
CERTIFICATE OF CORRECTION

| | |
|---|---|
| PATENT NO. | : 11,489,445 B2 |
| APPLICATION NO. | : 17/066128 |
| DATED | : November 1, 2022 |
| INVENTOR(S) | : Yingyi Yan |

It is certified that error appears in the above-identified patent and that said Letters Patent is hereby corrected as shown below:

In the Claims

In Column 12, Line 57, in Claim 1, delete "component" and insert --component;-- therefor Signed and Sealed this
Twelfth Day of September, 2023

*Katherine Kelly Vidal*

Katherine Kelly Vidal
*Director of the United States Patent and Trademark Office*